(12) United States Patent
Ruan et al.

(10) Patent No.: US 9,978,590 B1
(45) Date of Patent: May 22, 2018

(54) METHOD OF MANUFACTURING EPITAXIABLE HEAT-DISSIPATING SUBSTRATE

(71) Applicant: NATIONAL CHUNG SHAN INSTITUTE OF SCIENCE AND TECHNOLOGY, Taoyuan (TW)

(72) Inventors: Jian-Long Ruan, Taoyuan (TW); Shyh-Jer Huang, Taoyuan (TW); Hsin-Chieh Yu, Taoyuan (TW); Yang-Kuo Kuo, Taoyuan (TW)

(73) Assignee: NATIONAL CHUNG SHAN INSTITUTE OF SCIENCE AND TECHNOLOGY, Taoyuan (TW)

( * ) Notice: Subject to any disclaimer, the term of this patent is extended or adjusted under 35 U.S.C. 154(b) by 0 days. days.

(21) Appl. No.: 15/604,114

(22) Filed: May 24, 2017

(51) Int. Cl.
  *H01L 21/02* (2006.01)
  *H01L 21/30* (2006.01)
  *H01L 21/306* (2006.01)

(52) U.S. Cl.
  CPC ...... *H01L 21/0254* (2013.01); *H01L 21/0243* (2013.01); *H01L 21/02164* (2013.01); *H01L 21/02175* (2013.01); *H01L 21/02282* (2013.01); *H01L 21/02376* (2013.01); *H01L 21/02378* (2013.01); *H01L 21/02389* (2013.01); *H01L 21/02414* (2013.01); *H01L 21/02444* (2013.01); *H01L 21/02485* (2013.01); *H01L 21/30625* (2013.01)

(58) Field of Classification Search
  CPC ........... H01L 21/0254; H01L 21/30625; H01L 21/0243; H01L 21/02378; H01L 21/02485; H01L 21/02164; H01L 21/02444; H01L 21/02282; H01L 21/02175; H01L 21/02389; H01L 21/02376; H01L 21/02414
  USPC ........................................................ 438/503
  See application file for complete search history.

(56) References Cited

U.S. PATENT DOCUMENTS

| | | | |
|---|---|---|---|
| 6,974,501 B1* | 12/2005 | Zhang | C30B 23/02 117/106 |
| 2008/0121910 A1* | 5/2008 | Bergmann | H01L 21/02378 257/98 |
| 2011/0073834 A1* | 3/2011 | Hannon | H01L 29/16 257/9 |

* cited by examiner

*Primary Examiner* — Caleen Sullivan
(74) *Attorney, Agent, or Firm* — WPAT, PC

(57) ABSTRACT

A method of manufacturing an epitaxiable heat-dissipating substrate comprises the steps of (A) forming a roughened surface on a substrate made of a polycrystalline or amorphous material with a high thermal conductivity coefficient; (B) forming a flat layer on the roughened surface; and (C) forming a buffer layer on the flat layer. The flat layer reduces the surface roughness of the substrate, and then the buffer layer functions as a base for epitaxial growth, thereby being directly applicable to production of semiconductor devices which are flat and capable of isotropic epitaxial growth.

11 Claims, 5 Drawing Sheets

METHOD OF MANUFACTURING EPITAXIABLE HEAT-DISSIPATING SUBSTRATE

FIELD OF THE INVENTION

The present invention relates to methods of manufacturing heat-dissipating substrates and, more particularly, to a method of manufacturing epitaxiable heat-dissipating substrates.

BACKGROUND OF THE INVENTION

Due to the advancement of related semiconductor process technology and demand for diverse application of electronic products, the trend is toward miniaturization and high efficiency of semiconductor devices. As a result, the semiconductor industry is confronted with an issue, that is, heat dissipation of semiconductor devices, especially when it comes to application of high-frequency and high-power devices.

Take light-emitting diode (LED) devices as an example, although LEDs are highly efficient because they save power, but their weakness in heat dissipation hinders their application in high-power fields, such as headlights. The efficiency of light emission of LEDs depends on temperature. If heat emitted from LEDs is not dissipated away from the LED devices, the efficiency of light emission of the LEDs will deteriorate to the detriment of operation stability and service life. The unstable operation of LED devices not only poses a threat to personal safety and properties, such as headlights, but also seriously impedes the LED devices' market penetration.

Take GaN-based high electron mobility transistors (HEMT), with GaN semiconductor being characterized advantageously by high electron saturation velocity, high thermal stability, and high breakdown voltage, AlGaN/GaN HEMT displays high output power and thus is widely applied to microwave power amplifiers and transformers. However, waste heat generated as a result of high-power operation reduces the efficiency of devices greatly.

To reduce the aforesaid unfavorable effect of waste heat on the aforesaid devices, heat is usually removed away from the devices by heat dissipation design and management. The related prior art involves transferring a device onto a substrate with a high thermal conductivity coefficient. However, the transfer requires removing the device from the original epitaxial substrate by laser lift-off and bonding the device to the substrate with a high thermal conductivity coefficient by a wafer bonding technique. As a result, the transfer not only increases the manufacturing costs and complexity, but also compromises the yield. The related prior art also involves carrying out epitaxial production of devices (such as GaN LED or HEMT) with a monocrystalline substrate (such as a monocrystalline AlN (aluminium nitride) substrate) with a high thermal conductivity coefficient, as the high thermal conductivity of AlN is beneficial to heat dissipation and elimination of the need for device transfer. However, monocrystalline AlN substrates are difficult to obtain and expensive and thus render mass production infeasible.

Research on production of GaN materials by polycrystalline AlN substrates shows that polycrystalline AlN substrates are not uniform in rigidity and thus cannot attain nanoscale surface roughness simply by any polishing techniques, and in consequence the polycrystalline AlN substrates have rough surfaces to the detriment of subsequent GaN epitaxial growth. In addition to flattening, the related prior art is confronted with another problem, that is, a buffer layer is made of a material with c-axis preferred orientation, such as ZnO or AlN, to function as a pre-growth layer with correct c-axis upper lattices on which a GaN wafer grows. However, coalescence growth required for thin-film formation cannot occur in the same in-plane direction as the lattices, because polycrystalline AlN substrates are confronted with a problem, that is, random lattice surfaces.

As a result, the industrial sector needs a method of manufacturing an epitaxiable heat-dissipating substrate so that the epitaxiable heat-dissipating substrate has a high degree of flatness and high quality, and thus is suitable for manufacturing semiconductor devices anticipated by the industrial sector.

SUMMARY OF THE INVENTION

In view of the aforesaid drawbacks of the prior art, it is an objective of the present invention to provide a method of manufacturing an epitaxiable heat-dissipating substrate made of a polycrystalline or amorphous material with a high thermal conductivity coefficient and directly adapted for use in epitaxial growth.

According to the present invention, the process of manufacturing a substrate required for semiconductor devices involves cutting a polycrystalline or amorphous material with a high thermal conductivity coefficient to attain the size of the substrate, flattening the roughened surface of the substrate by a flat layer, and covering the flat layer with a buffer layer. Hence, the present invention provides an epitaxiable heat-dissipating substrate to overcome two drawbacks of the prior art: first, at the end of epitaxial growth, devices must be lifted off and transferred to the heat-dissipating substrate; second, a pricey monocrystalline heat-dissipating substrate is required.

In order to achieve the above and other objectives, the present invention provides a method of manufacturing an epitaxiable heat-dissipating substrate, comprising the steps of: (A) forming a roughened surface on a substrate made of a polycrystalline or amorphous material with a high thermal conductivity coefficient; (B) forming a flat layer on the roughened surface; and (C) forming a buffer layer on the flat layer.

In step (A) the substrate is made of aluminum nitride (AlN), beryllium oxide (BeO), diamond or silicon carbide (SiC), whereas the roughened surface is formed by a grinding-polishing process, and the roughened surface has a root-mean-square roughness of 10 nm~100 nm. The reason why the grinding-polishing process is performed in the course of producing a substrate from a polycrystalline or amorphous material is that it is performed to produce a mirror-like surface conducive to a subsequent process. However, conventional grinding-polishing technology cannot achieve the surface flatness required for epitaxy; hence, the present invention further proposes a flat layer. Due to the technical limitation of the conventional grinding-polishing process, the least root-mean-square roughness of the roughened surface is around 10 nm. An overly low surface roughness leads to deterioration of the adhesion of the flat layer subsequently formed. By contrast, an overly great surface roughness causes a problem as follows: the thickness of the flat layer with poor thermal conductivity must be increased in order to compensate for the vertical difference of the substrate surface; as a result, the overall thermal conductivity of the substrate deteriorates, although the substrate is made of a material with a high thermal conductivity coefficient. Hence, the present invention proposes a roughened surface to maintain a fixed range of roughness and thereby increase the contact area between the flat layer and the substrate surface, thereby enhancing the adhesion of the flat layer.

In step (B), the flat layer is formed by a spin coating process, and a spin-coating material for use in the spin coating process is one of $SiO_2$, ZnO and NiO. In step (B) the flat layer has a root-mean-square roughness of 0.1 nm~3 nm and a thickness of 20 nm~150 nm to match the surface roughness of the roughened surface of step (A), so as to compensate for the vertical difference of the roughened surface, preclude discontinuous thin-film formation of the spin-coated flat layer, ensure the adhesion of the flat layer, and maintain the overall thermal conductivity of the substrate. The method of the present invention involves using a spin-coating material, such as $SiO_2$, ZnO or NiO, in the spin coating process to improve the roughness of the polycrystalline AlN, wherein the spin-coating oxide and process are readily available and easily performed. Take spin-on glass (SOG) as an example, to effectuate thin-film formation in a liquid state by SOG, a dielectric substance dissolved in a solvent is spin-coated on a chip which needs to be flattened so that the dielectric substance and solvent together fill a groove before being cured at high temperature, thereby forming on the chip a substance that behaves like silicon dioxide, smoothening surface profile to achieve local flattening.

In step (C), a two-dimensional material is adhered to the flat layer of step (B) to form the buffer layer, wherein the two-dimensional material is graphene, molybdenum sulfide or tungsten sulfide, and the two-dimensional material has a thickness of 1~5 atomic layers. The flattening issue is addressed by a spin-coat material, but a substrate made of a polycrystalline or amorphous material is disadvantaged by random lattice surfaces; hence, the present invention proposes using a two-dimensional material to serve as a buffer layer in order to meet the need for an epitaxial growth lattice direction, and the two-dimensional material is adhered to the flat layer surface by a transfer step and under van der Waals forces. For example, the use of graphene (two-dimensional material) meets the need to grow a GaN epitaxial wafer both along the c-axis and in in-plane lattices. With graphene being provided in the form of a planar thin-fim with hexagonal beehive-like lattices, it is a good buffer growth layer to wurtzite GaN, as it promotes GaN growth both along the c-axis and in the in-plane direction.

Regarding the method of the present invention, an epitaxial wafer is grown on the buffer layer, and the epitaxial wafer is made of GaN. The substrate produced in step (c) is placed in an epitaxy machine for growing directly a high-temperature epitaxial material through adjustment of temperature, thickness, pressure, and a carrier gas.

The present invention provides a method of manufacturing an epitaxiable heat-dissipating substrate. The method of the present invention involves coating a spin-coating material uniformly on a rough surface of a substrate made of a polycrystalline or amorphous material with a high thermal conductivity coefficient by a spin coating process to enhance the flatness of the substrate and using a two-dimensional material with periodic lattice arrangement as a buffer layer which functions as a base for epitaxial growth to facilitate a subsequent epitaxial growth process. The root-mean-square roughness of the surface of the epitaxiable heat-dissipating substrate produced according to the present invention is reduced to less than 3 nm. The structures and surfaces of the flat layer, buffer layer and epitaxial layer of the substrate thus produced according to the present invention are examined by electron microscopy, showing that the particles of the epitaxial layer have a uniform size and are tightly arranged. This proves that the method of manufacturing an epitaxiable heat-dissipating substrate, provided by the present invention, is so easy and simple that it is applicable to the production of high-quality epitaxial devices so as for the industrial sector to achieve economic improvements.

The summary above, the detailed description below, and the accompanying drawings further explain the measures and means used to achieve predetermined objectives of the present invention and the advantages of the present invention. The other objectives and advantages of the present invention are explained by the description below and the accompanying drawings.

DETAILED DESCRIPTION OF THE PREFERRED EMBODIMENTS

Implementation of the present invention is hereunder illustrated by specific, preferred embodiments so that persons skilled in the art can easily understand the advantages and benefits of the present invention by referring to the disclosure of the specification.

The present invention provides a method of manufacturing an epitaxiable heat-dissipating substrate. The method of the present invention involves forming a flat layer on a substrate made of a polycrystalline or amorphous material with a high thermal conductivity coefficient by a spin coating process to improve the substrate surface roughness by the flat layer and thus enhance the flatness of subsequent epitaxial growth, and then forming a buffer layer on the flat layer. Using a two-dimensional material with an atomic-layer thickness, such as graphene, as a buffer layer can reduce lattice mismatch and thermal expansion differences between the buffer layer and the flat layer. Since the physical attraction between the graphene buffer layer and flat layer occurs under van der Waals forces instead of chemical bonds, deformation otherwise arising from the lattice mismatch and thermal expansion differences does not occur. The hexagonal beehive-like lattice planar structure and the periodic lattice arrangement of the graphene two-dimensional material are conducive to lattice growth of a wurtzite GaN (gallium nitride) epitaxial layer along the c-axis and in the in-plane direction, thereby enhancing the quality of epitaxial growth along the c-axis and in the in-plane direction and facilitating subsequent production of high-quality epitaxial layer materials.

Figure 1:
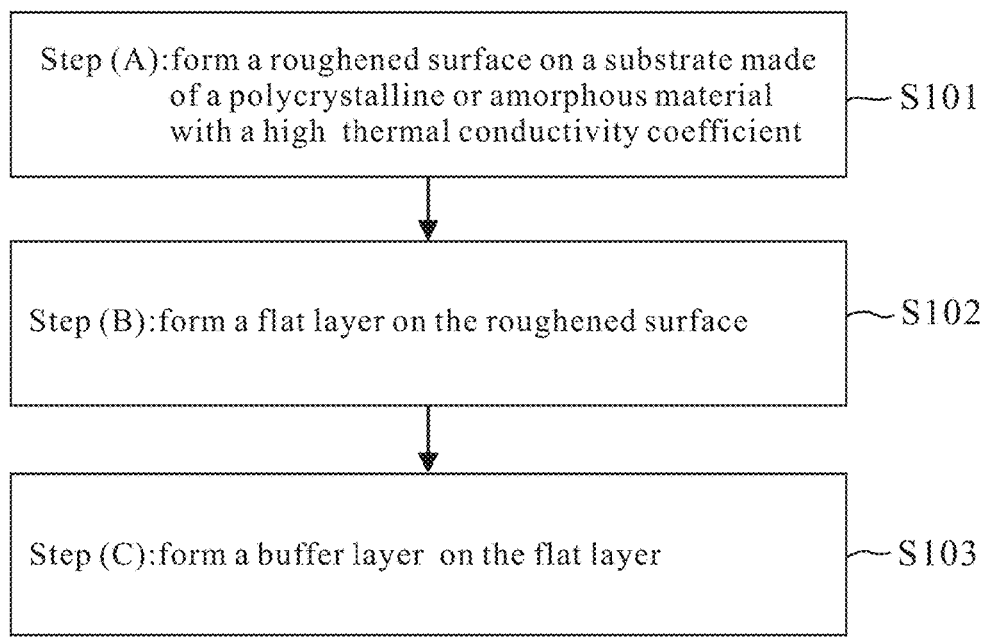
FIG. 1 is a flowchart of a method of manufacturing an epitaxiable heat-dissipating substrate according to the present invention.
Figure 2:
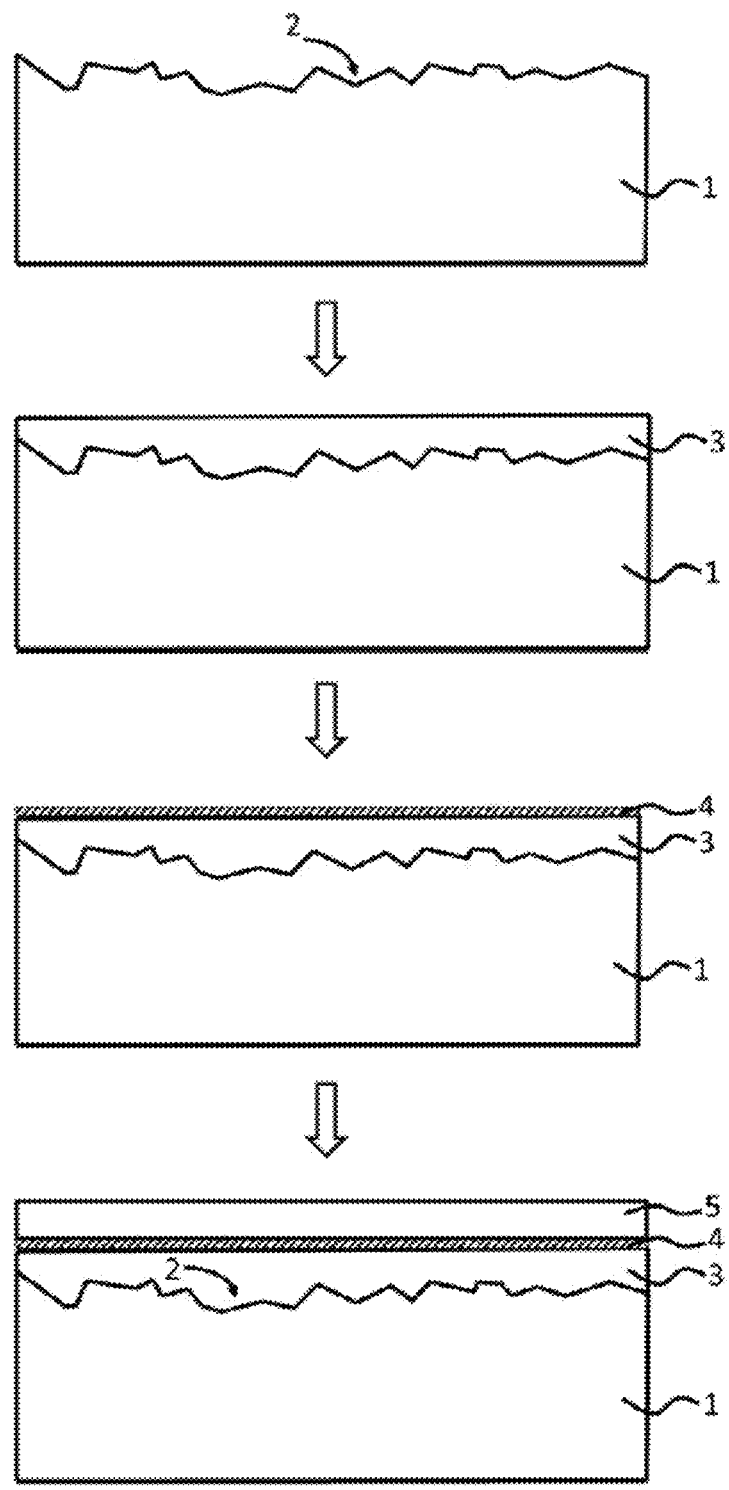
FIG. 2 is a schematic view of the process flow of the method of manufacturing an epitaxiable heat-dissipating substrate according to the present invention.

Referring to FIG. 1 and FIG. 2, there are shown a flowchart and a schematic view of a method of manufacturing an epitaxiable heat-dissipating substrate according to the present invention, respectively. As shown in the diagrams, the method of manufacturing an epitaxiable heat-dissipating substrate comprises the steps of: (A) forming a roughened surface on a substrate made of a polycrystalline or amorphous material with a high thermal conductivity coefficient S101; (B) forming a flat layer on the roughened surface S102; and (C) forming a buffer layer on the flat layer S103.

Regarding the method of the present invention, an epitaxial wafer is grown on the buffer layer, and the epitaxial wafer is made of GaN.

Embodiment

First, a grinding-polishing process is performed to form a roughened surface on a polycrystalline AlN substrate so that the roughened surface has a surface roughness of 10 nm 100 nm. Then, a spin coating process is performed to effectuate primary spin coating and secondary spin coating on a silicon dioxide (SOG) flat layer at 3000 rpm for 10 seconds. Upon completion of each instance of spin coating, a baking step is carried out to remove residues of the organic solvent from the silicon dioxide layer and promote thin-film cross-linking. The baking step is carried thrice at 80° C., 150° C., 250° C., respectively, each for 60 seconds.

Commercially-available graphene is covered with polymethylmethacrylate (PMMA) by a conventional transfer technique to fix the graphene in place and thereby facilitate a subsequent transfer step. Afterward, a carrier nickel substrate beneath the graphene is dissolved by $FeCl_3$ and thus removed. Then, the graphene is immersed in deionized water (DI water) to remove residual solution. Afterward, the PMMA/graphene is transferred to the flat layer surface from which the PMMA is then removed by acetone. At this moment, GaN-based metal-organic chemical vapor deposition (MOCVD) epitaxial growth process can be carried out. In this embodiment, the best epitaxial parameters for GaN include a low-temperature GaN nucleation layer growth temperature of 540° C., growth pressure of 300 mtorr, high-temperature GaN epitaxial layer growth temperature of 1150'C, and V/III ratio of 200.

Figure 3:
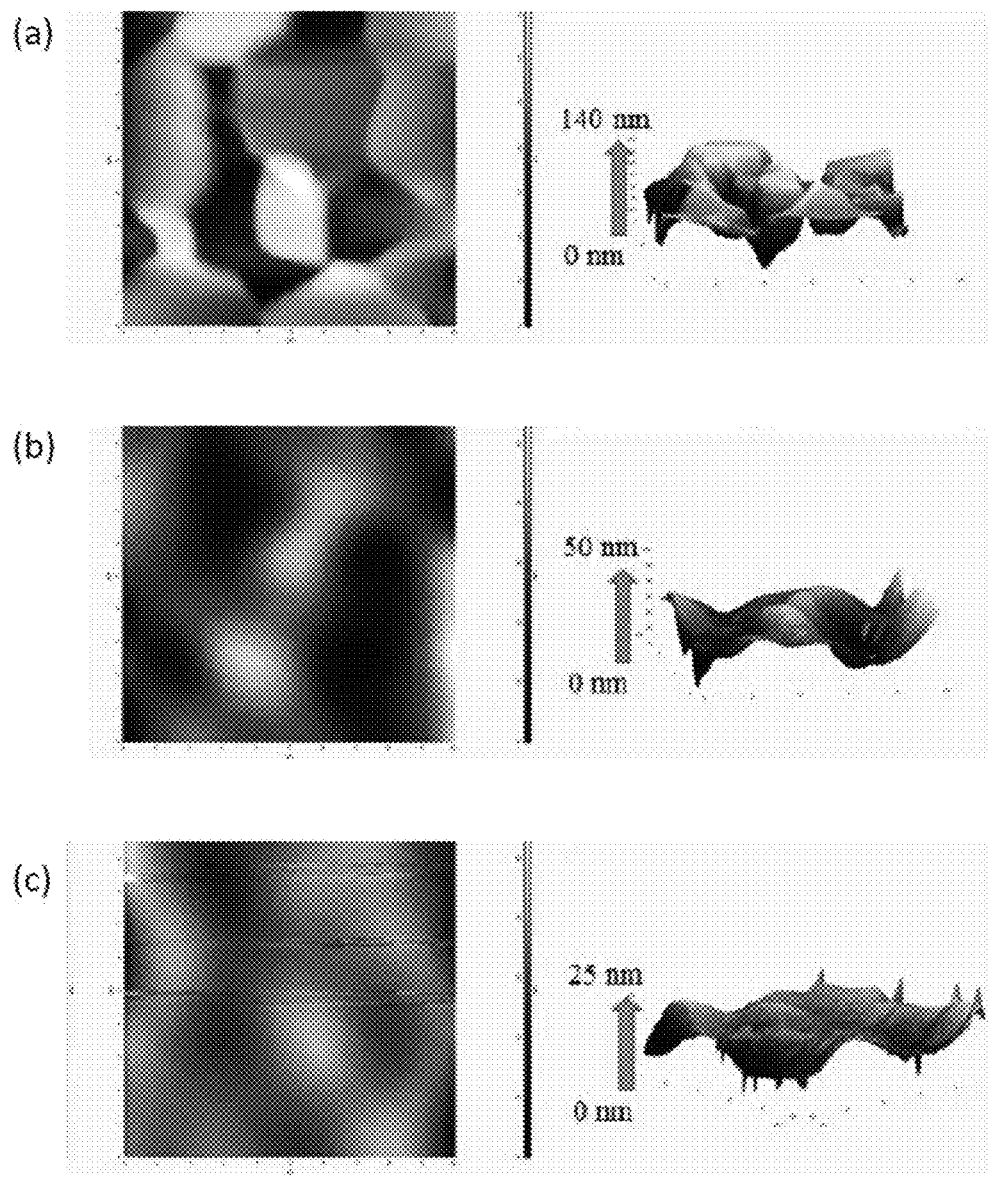
FIG. 3 are atomic force microscope images of surfaces of a substrate and a flat layer according to an embodiment of the present invention.

Referring to FIG. 3, there are shown atomic force microscope images of surfaces of a substrate and a flat layer according to an embodiment of the present invention. As shown in FIG. 3(a), after undergoing the grinding-polishing process, the polycrystalline AlN (aluminum nitride) substrate still fails to attain nanoscale surface roughness, as it has a root-mean-square roughness of 26.68 nm. After undergoing silicon dioxide-based primary spin coating, the surface of the polycrystalline AlN substrate has a root-mean-square roughness of 9.54 nm, as shown in FIG. 3(b). After undergoing silicon dioxide-based secondary spin coating, the surface of the polycrystalline AlN substrate has a root-mean-square roughness of 2.87 nm, as shown in FIG. 3(c), indicating that the surface flatness of the substrate with a roughened surface is effectively enhanced because of flattening surface spin coating.

Figure 4:
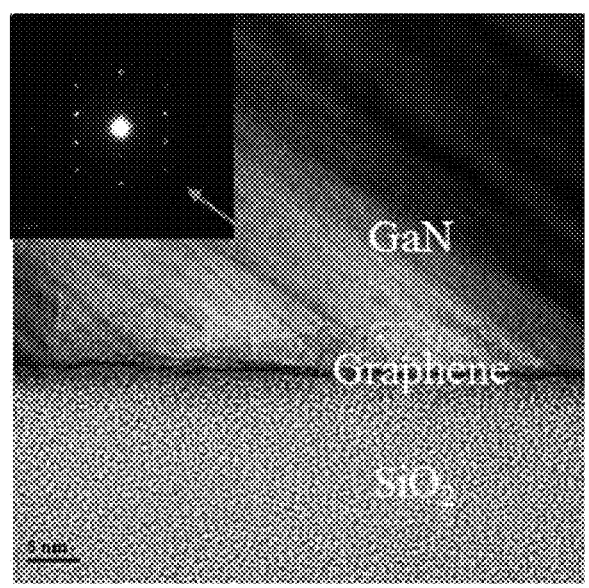
FIG. 4 is a transmission electron microscope image of the substrate according to an embodiment of the present invention.

Referring to FIG. 4, there is shown a transmission electron microscope (TEM) image of the substrate according to an embodiment of the present invention. As shown in the diagram, a flat layer made of silicon dioxide ($SiO_2$), a buffer layer made of graphene, and an epitaxial layer made of GaN are arranged from bottom to top, and TEM diffraction analysis conducted thereon reveals that the epitaxial layer has a GaN-containing diffraction crystal surface. This proves that, in the embodiment of the invention, an epitaxiable heat-dissipating substrate is manufactured to enable satisfactory epitaxial growth.

Figure 5:
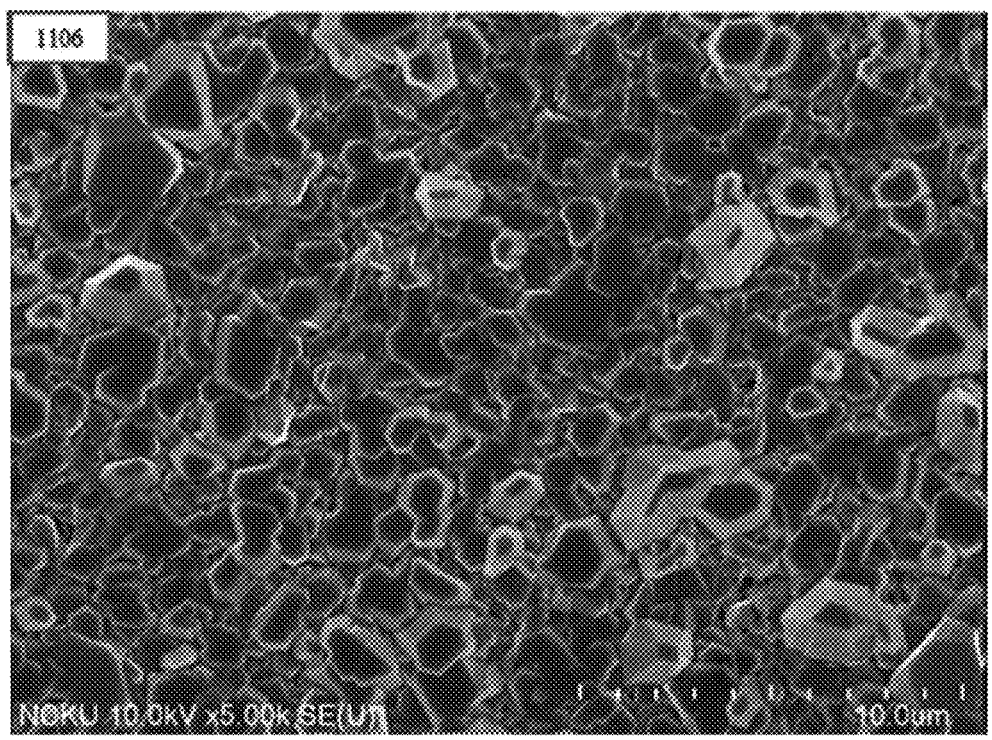
FIG. 5 is a scanning electron microscope image of an epitaxial wafer according to an embodiment of the present invention.

Referring to FIG. 5, there is shown a scanning electron microscope image of an epitaxial wafer according to an embodiment of the present invention. As shown in the diagram, the surfaces of an GaN epitaxial wafer are analyzed, showing that GaN particles have a uniform size and are tightly arranged. This proves that the substrate manufactured by the method of the present invention functions as a base for epitaxial growth to facilitate subsequent uniform epitaxial growth.

The present invention provides a method of manufacturing an epitaxiable heat-dissipating substrate. The method of the present invention involves spin coating a spin-coat material on a roughened surface of a substrate made of a polycrystalline or amorphous material with a high thermal conductivity coefficient so that the root-mean-square roughness of the surface of the epitaxiable heat-dissipating substrate is reduced to less than 3 nm to fulfill the requirements of an epitaxiable thin-film. The method of the present invention further involves using a two-dimensional material with periodic lattice arrangement as a buffer layer which functions as a base for epitaxial growth to facilitate a subsequent isotropic epitaxial growth, wherein the two-dimensional material which adheres to the flat layer well is unlikely to escape in the high-temperature, high-gas-current environment of the epitaxial growth process. Therefore, the epitaxiable heat-dissipating substrate manufacturing by the method of the present invention is applicable directly to production of epitaxial devices for flat and isotropic crystal growth, thereby having wider application.

The above embodiments are illustrative of the features and effects of the present invention rather than restrictive of the scope of the substantial technical disclosure of the present invention. Persons skilled in the art may modify and alter the above embodiments without departing from the spirit and scope of the present invention. Therefore, the scope of the protection of rights of the present invention should be defined by the appended claims.

What is claimed is:

1. A method of manufacturing an epitaxiable heat-dissipating substrate, comprising the steps of:
   (A) forming a roughened surface on a substrate made of a polycrystalline or amorphous material with a high thermal conductivity coefficient;
   (B) forming a flat layer on the roughened surface; and
   (C) forming a buffer layer on the flat layer,
   wherein an epitaxial wafer is grown on the buffer layer.

2. The method of claim 1, wherein in step (A) the substrate is made of one of AlN, BeO, diamond and SiC.

3. The method of claim 1, wherein in step (A) the roughened surface is formed by a grinding-polishing process.

4. The method of claim 1, wherein in step (A) the roughened surface has a root-mean-square roughness of 10 nm~100 nm.

5. The method of claim 1, wherein in step (B) the flat layer is formed by a spin coating process.

6. The method of claim 5, wherein a spin-coating material for use in the spin coating process is one of $SiO_2$, ZnO and NiO.

7. The method of claim 1, wherein in step (B) the flat layer has a root-mean-square roughness of 0.1 nm~3 nm and a thickness of 20 nm~150 nm.

8. The method of claim 1, wherein in step (C) a two-dimensional material is adhered to the flat layer of step (B) to form the buffer layer.

9. The method of claim 8, wherein the two-dimensional material is one of graphene, molybdenum sulfide and tungsten sulfide.

10. The method of claim 9, wherein the two-dimensional material has a thickness of 1~5 atomic layers.

11. The method of claim 1, wherein the epitaxial wafer is made of GaN.

\* \* \* \* \*